United States Patent [19]
Patel et al.

[11] 4,130,766
[45] Dec. 19, 1978

[54] BUCKET BRIGADE CIRCUIT

[75] Inventors: Mukesh P. Patel, Manassas, Va.;
Huo-Bing Yin, Potomac, Md.

[73] Assignee: International Business Machines Corporation, Armonk, N.Y.

[21] Appl. No.: 842,004

[22] Filed: Oct. 13, 1977

Related U.S. Application Data

[63] Continuation of Ser. No. 632,747, Nov. 17, 1975, abandoned.

[51] Int. Cl.² .................. G11C 19/28; G11C 19/18; H03K 17/10; H03K 17/16
[52] U.S. Cl. ........................ 307/221 D; 307/200 B; 307/221 C; 307/251; 307/264; 307/DIG. 4
[58] Field of Search ............... 307/200 B, 208, 221 C, 307/221 D, DIG. 4, 220 C, 251, 264

[56] References Cited

U.S. PATENT DOCUMENTS

| | | | |
|---|---|---|---|
| 3,546,490 | 12/1970 | Sangster | 307/246 X |
| 3,575,609 | 4/1971 | Izumi | 307/221 C |
| 3,745,383 | 7/1973 | Sangster | 307/221 C X |
| 3,789,239 | 1/1974 | Heeren | 307/221 C |
| 3,983,414 | 9/1976 | Stafford et al. | 307/251 |

OTHER PUBLICATIONS

Sangster, *Philips Tech. Review*, vol. 31, No. 4, pp. 97–110; 1970.

Primary Examiner—Larry N. Anagnos
Attorney, Agent, or Firm—John E. Hoel

[57] ABSTRACT

An improved bucket brigade circuit is disclosed having an improved transfer efficiency and dynamic range. Conventional bucket brigade circuits consist of a chain of storage capacitors and charge transfer circuits functioning as an analog shift register. Due to the nodal capacitance at the first load of prior art circuits, the charge thereon cannot be maintained at an optimum level because of voltage pull-back and charge redistribution during the fall time of the clock pulse. The invention disclosed herein provides an additional capacitor connecting the first node of the circuit to the inverse of the clock waveform, thereby eliminating the voltage pull-back and charge redistribution problem, resulting in an improved charge transfer efficiency and dynamic range for the circuit.

7 Claims, 4 Drawing Figures

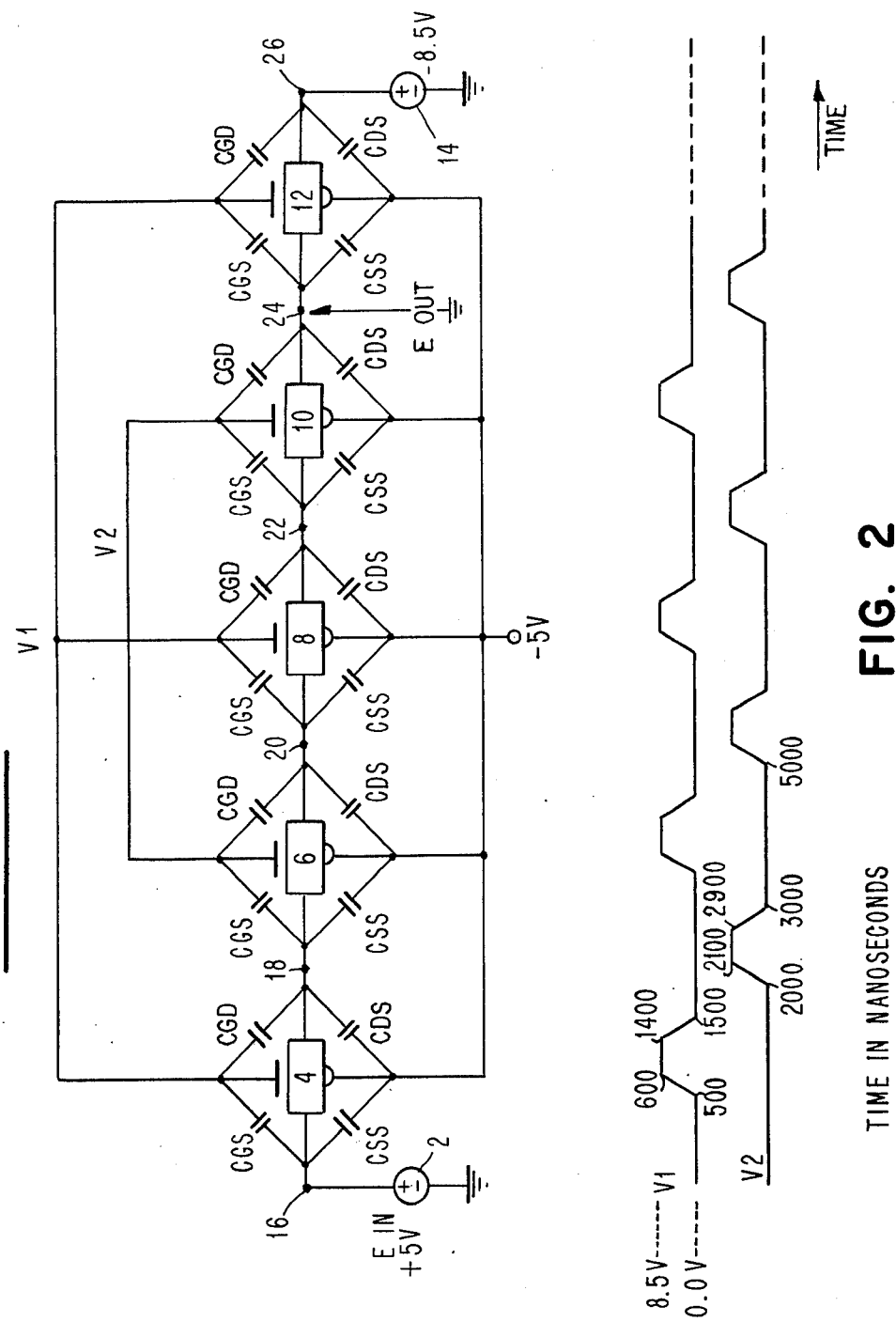

BUCKET BRIGADE CIRCUIT

This is a continuation of application Ser. No. 632,747 filed Nov. 17, 1975, now abandoned.

FIELD OF THE INVENTION

The invention disclosed relates to digital circuitry and more particularly relates to bucket brigade circuits.

BACKGROUND OF THE INVENTION

Bucket brigade devices have been used for analog signal processing applications in which the signal propagates from the input node to the output node via a chain of shift registers composed of bucket brigade devices. The bucket brigade device is an analog shift register comprising a chain of storage capacitors and charge transfer circuits. As disclosed by Sangster in U.S. Pat. No. 3,745,383, the bucket brigade analog shift register of the prior art employing MOSFET devices, as shown in FIG. 1, uses two complementary clocks with a frequency equal to the sampling frequency applied to the controlling gates alternately. The signal delay can thus be accurately controlled, or if required, can be changed electronically. Because there are no DC gate currents, signal attenuation is negligible even after hundreds of stages, and no amplifiers are necessary.

In the prior art circuit shown in FIG. 1, the input signal source $E_{in}$ is connected to the bucket brigade circuit at the source of FET device 4. The gate of FET device 4 is controlled by the V1 clock pulse as shown in FIG. 2. The input signal $E_{in}$ from the input signal source 2 is transferred during V1 clock time as a unit of charge through the FET device 4 to the node 18 connecting the drain of device 4 to the source of FET device 6. FET device 6 has its gate connected to the second clock waveform V2 as shown in FIG. 2. The charge stored at node 18 as transferred to node 20 during V2 time via device 6. The unit of charge representing the input signal $E_{in}$ is propagated down the chain of FET devices 4, 6, 8, and 10 by the alternate operation of their respective gates by means of the clock pulses V1 and V2. The unit of charge representing the input signal ultimately is output at the output node 24. It is then necessary for the charge to be transferred from the input node to the output node with as little loss as possible. The voltage source 14 provides the bias for the circuit. FET type bucket brigade devices can be fabricated using standard MOSFET processing techniques.

Transfer efficiency and dynamic range are paramount criteria in the design of a bucket brigade device. As is shown in the prior art circuit of FIG. 1, associated with each FET device are four characteristic capacitances; the gate to source capacitance $C_{GS}$, the source to substrate capacitance $C_{SS}$, the drain to substrate capacitance $C_{DS}$, and the gate to drain capacitance $C_{GD}$. Due to the capacitances at node 18 in the prior art bucket brigade device of FIG. 1, charge representing the input signal at node 18, cannot be maintained at an optimum level because of voltage pull-back and a charge redistribution during the fall time of the V1 clock pulse. Consequently, the voltage at the end of the phase time at any subsequent node is lower compared to that at the input node 16. This problem of voltage pull-back and charge redistribution at node 18 can be explained as follows.

For efficient charge transfer from the source to drain of an FET device, the gate voltage must be one threshold voltage $V_t$ (including the substrate body effect) higher than the voltage applied to the source. This is illustrated in FIG. 1 and FIG. 2 such that $$V1 > E_{in} + V_t \tag{1}$$

where $V_1 = 8.5V$, and $E_{in} = 5.0V$. This illustration is for N-channel LSI FET circuits.

During the phase V1 time, the input signal $E_{in}$ is fully transferred to the node 18 via FET device 4. The nodal voltage is represented by the charge stored in the nodal capacitance consisting of $C_{DS}$ and $C_{GD}$ of FET 4 and $C_{GS}$ and $C_{SS}$ of FET 6. $C_{GD}$ also acts as a coupling capacitor between clock V1 and the node 18. Thus, the nodal charge will be influenced by the fluctuation of V1. When the clock V1 is pulling back, the nodal charge remains practically unchanged until V1 falls below $E_{in}$. Then the FET device 4 stops conducting and the nodal charge at the node 18 flows out and follows the pull-back of V1 through the coupling capacitance $C_{GD}$. The resultant nodal voltage at the end of V1 phase time will be lowered due to the charge redistribution among all capacitors. The magnitude of voltage loss due to charge redistribution can be calculated as $$\left[ E_{in} \frac{C_{GD}}{C_{GD} + C_{DS} + C_{GS} + C_{SS}} \right]. \tag{2}$$

Thus the resultant nodal voltage at the end of V1 phase time becomes $$E_{in} \left[ 1 - \frac{C_{GD}}{C_{GD} + C_{DS} + C_{GS} + C_{SS}} \right]. \tag{3}$$

It is evident that the resultant voltage at the node 18 is always less than $E_{in}$ since $C_{GD}$ is always present in the FET devices. This known circuit suffers from the disadvantages that the optimum charge transfer cannot be achieved and the dynamic range is reduced as a result of charge redistribution due to clock pull-back.

Thus it is seen that what the prior art requires is a bucket brigade device which has a higher transfer efficiency and dynamic range.

OBJECTS OF THE INVENTION

It is therefore an object of the invention to provide a bucket brigade device having an improved charge transfer efficiency.

It is still another object of the invention to provide a bucket brigade device having an improved dynamic range.

SUMMARY OF THE INVENTION

These and other objects, features and advantages of the invention will be accomplished by the improved bucket brigade circuit disclosed herein. An FET bucket brigade shift register device has a first input FET device, its gate connected to a first phase clock waveform, and a characteristic gate to drain capacitance at a first node connecting its drain to the source of the second FET device. The gate of the second FET device is connected to a second phase clock waveform. The improvement to the circuit comprises connecting a capacitor of magnitude equal to the characteristic gate to drain capacitance of the first FET switching device in the bucket brigade chain, between the first node and the inverse of the first phase clock waveform. In this manner, the voltage pull-back and charge redistribution at the first node of the bucket brigade circuit is eliminated during the fall time of the first phase clock waveform. This enhances the charge transfer efficiency and dynamic range of the resulting bucket brigade device circuit. The invention is also applicable to bucket brigade circuits employing bipolar transistor devices.

shown in FIG. 2, the voltage magnitude at node 18, node 20, node 22, and node 24 is shown in the following Table 1. It shows the charge transfer in terms of nodal voltage at various nodes during different controlling phase clock times.

TABLE 1

| NODE/VOLTS | CONVENTIONAL CIRCUIT | | | | | | | |
|---|---|---|---|---|---|---|---|---|
| | At the start of V1 | During V1 pulse | At the end of V1 | During V2 pulse | At the end of V2 | During V1 pulse | At the end of V1 | During V2 pulse | At the end of V2 |
| 18 | 4.90 | 5.0 | 3.84 | 6.33 | 4.90 | 5.0 | 3.79 | 6.33 | 4.9 |
| 20 | 3.55 | 6.33 | 4.75 | 9.32 | 3.60 | 6.33 | 4.75 | 9.25 | 3.54 |
| 22 | 4.75 | 9.28 | 3.56 | 6.33 | 4.75 | 9.33 | 3.61 | 6.33 | 4.75 |
| 24 | 3.61 | 6.33 | 4.75 | 9.28 | 3.57 | 6.33 | 4.75 | 9.34 | 3.62 |

DESCRIPTION OF THE FIGURES

These and other objects, features and advantages of the invention will be more particularly understood with reference to the accompanying drawings.

FIG. 1 illustrates the prior art bucket brigade device.

FIG. 2 illustrates the waveform for the clock pulses input to the prior art circuit of FIG. 1.

DISCUSSION OF THE PREFERRED EMBODIMENT

Figure 3:
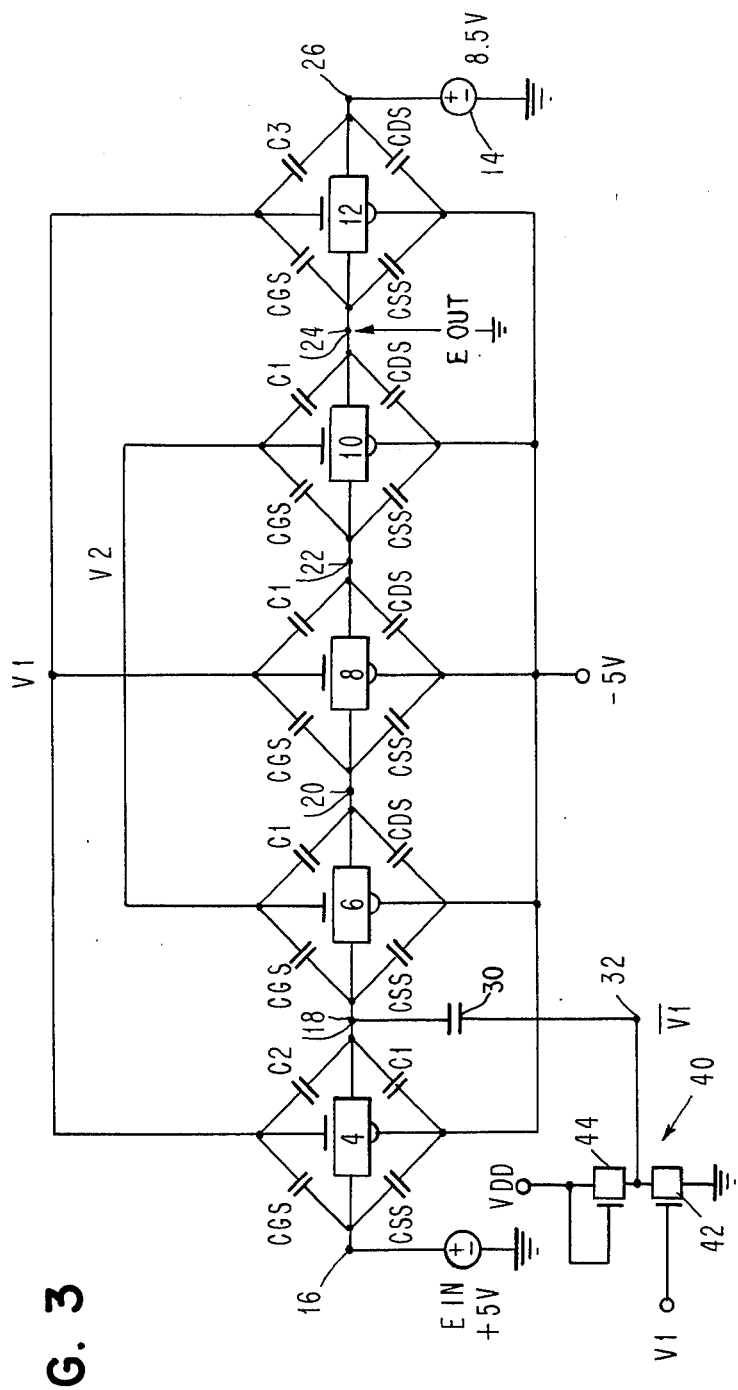
FIG. 3 illustrates the improved bucket brigade device invention.

As described above, FIG. 1 illustrates the prior art bucket brigade device which suffers from the problems of an impaired charge transfer efficiency and dynamic range due to the phenomenon of voltage pull-back and charge redistribution at node 18. FIG. 3 illustrates the subject invention which cures the voltage pull-back and charge redistribution problems.

The bucket brigade circuit of FIG. 3 is shown with a sequence of 5 FET devices 4, 6, 8, 10 and 12 each respectively connected with the drain of a first FET and connected to the source of a second FET at succeeding nodes 18 through 24. In this example, the bucket brigade circuit would be an N-channel LSI MOS circuit. Each FET device would have a gate width to length ratio of 2.12. The gate to source capacitance $C_{GS}$ of each device is 0.089 pico-farads. The source to substrate capacitance of each FET device $C_{SS}$ is 0.0175 pico-farads. The gate to drain capacitance C1 of the FET devices 6, 8, and 10 is 0.284 pico-farads. The drain to substrate capacitance of FET devices 6, 8, and 10 is 0.05 pico-farads. The gate to drain capacitance of the input FET device 4 is C2 which is equal to 0.1216 pico-farads. The drain to substrate capacitance of the input FET device 4 is C1 which is equal to 0.284 pico-farads. For the FET device 12, the gate to drain capacitance of C3 is equal to the 0.089 pico-farads and the drain to substrate capacitance $C_{DS}$ is equal to 0.05 pico-farads. These values can be identical for both the prior art bucket brigade device of FIG. 1 and the disclosed bucket brigade device of FIG. 3. It is apparent to anyone of ordinary skill in the art that C1 and C2 associated with the FET device 4 of FIG. 3 is identical to $C_{DS}$ and $C_{GD}$, respectively, of FET device 4 of FIG. 1. Similarly, $C_1 = C_{GD}$ of device 6, 8 and 10 and $C_3 = C_{GD}$ of device 12, as is shown in FIGS. 1 and 3.

With an input signal magnitude $E_{in}$ of +5 volts and a substrate potential of −5 volts, and with the V1 and V2 clock waveforms having a magnitude of 8.5 volts as It is seen that the voltage at node 18 is only 3.84 volts at the end of V1 as compared to the input, $E_{in} = 5$ volts. The loss of voltage amplitude at node 18 is due to pull-back of the clock V1 through the coupling capacitance, $C_{GD}$ as predicted by the equation (2). Thus the subsequent nodes can never reach the input voltage value of $E_{in}$. The subsequent nodes 20, 22 and 24 exhibit the transferred voltage of only 3.60V, 3.61V and 3.62V, respectively, at the end of their respective clock times. The signal amplitude $E_{out}$ at output node 24 for the prior art bucket brigade circuit will have a value of 3.62 volts. It is obvious that the prior art bucket brigade circuit suffers lower transfer efficiency and exhibits a small dynamic range.

By connecting capacitor 30 at the first node 18, having a capacitance equal to the characteristic gate to drain capacitance C2 of the first FET device 4, and connecting the opposite terminal 32 of the capacitor 30 to the inverse of the first phase clock waveform V1, which is shown in FIG. 3, the voltage pull-back and charge redistribution phenomena are eliminated at the first node 18 during the fall time of the first phase clock waveform V1. This enhances the charge transfer efficiency and dynamic range of the bucket brigade circuit of FIG. 3. The inverter 40 comprising FETs 42 and 44, inverts the V1 signal for input at terminal 32. The operation of the capacitor 30 in improving the voltage pull-back and charge redistribution characteristics of node 18 can be explained as follows.

It has been illustrated in the previous section that the charge has been pulling out from the node 18 during the fall time of the clock. Since the capacitor 30 is made equal to $C_2$ and is connected between the node 18 and the inverse of V1 as shown in FIG. 3, the inverse clock will furnish (replenish) charge to the node through capacitor 30 as the inverse clock is rising, in contrast to the falling of the clock V1. If the rise time and the fall time of $\overline{V1}$ and V1 are exactly complementary to each other, the charge flowing into the node and out from the node through capacitor 30 and $C_2$, respectively, will be identical and the net charge at the node remains the same at the end of phase time as compared to that during the phase time. Hence, the voltage at the node 18 will remain constant and equal to $E_{in}$ at the end of the phase time. This eliminates the charge redistribution due to pull-back of the clock. The optimum charge transfer is therefore obtained and the dynamic range is enhanced.

Figure 4:
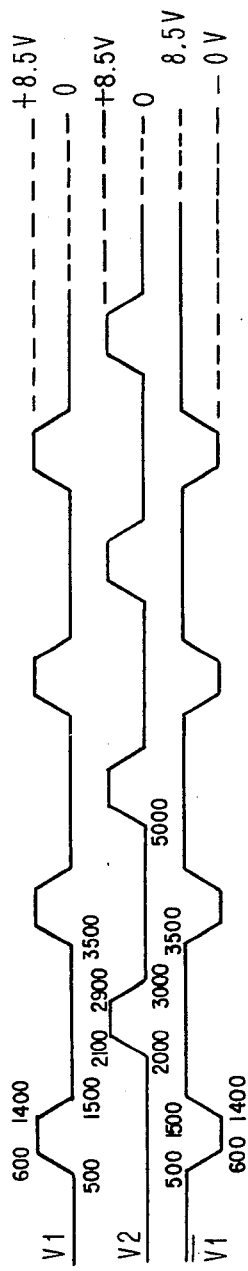
FIG. 4 illustrates the clock waveforms to drive the circuit of FIG. 3.

Using the same values for the width to length ratio of the FET devices, capacitances, input signal, clock waveform, and substrate voltages as were specified for the prior art circuit shown in FIG. 1, the charge transfer characteristics for the circuit of FIG. 3 employing the input signal of FIG. 4, are illustrated in the following Table II.

TABLE II

| | IMPROVED CIRCUIT | | | | | | | | |
|---|---|---|---|---|---|---|---|---|---|
| NODE/VOLTS | At the start of V1 | During V1 pulse | At the end of V1 | During V2 pulse | At the end of V2 | During V1 pulse | At the end of V1 | During V2 pulse | At the end of V2 |
| 18 | 5.09 | 5.0 | 5.0 | 6.33 | 5.09 | 5.0 | 5.0 | 6.33 | 5.09 |
| 20 | 4.64 | 6.33 | 4.75 | 10.38 | 4.64 | 6.33 | 4.75 | 10.38 | 4.64 |
| 22 | 4.75 | 10.38 | 4.64 | 6.33 | 4.75 | 9.33 | 4.64 | 6.33 | 4.75 |
| 24 | 4.65 | 6.33 | 4.75 | 10.38 | 4.65 | 6.33 | 4.75 | 10.38 | 4.64 |

The nodal voltages at nodes 18, 20, 22 and 24 are 5.0, 4.64, 4.64, and 4.64 volts respectively, at the end of the respective phase clock times. It is obvious that the nodal voltage has been enhanced as compared to that shown in Table I for the prior art circuit.

Thus it is seen that by the addition of the capacitor 30 connecting the first input node 18 to the inverse of the input waveform V1, the voltage pull-back and charge redistribution phenomena at the node 18 during the fall time of the V1 waveform, are substantially eliminated. With this change in the circuit, a full voltage signal can be transferred from the input node to node 18 and subsequently to the following nodes. This results in an increased charge transfer efficiency and an enhanced dynamic range for the bucket brigade circuit.

The invention disclosed herein should not be construed as being limited to field effect transistor type bucket brigade devices, but is also applicable to solving the voltage pull-back and charge redistribution problems of bucket brigade devices employing bipolar transistors, such as is disclosed in U.S. Pat. No. 3,546,490 to Sangster. In the bipolar application, the capacitor 30, with its terminal connected to the node 18 of FIG. 3, will be connected to the node formed between the collector of the first or input bipolar transistor and the emitter of a second bipolar transistor which is series connected with the first bipolar transistor, in the bucket brigade device. The inverter circuit generating $\overline{V1}$ can be fabricated on chip.

While the invention has been particularly shown and described with reference to the preferred embodiments thereof, it will be understood by those skilled in the art that the foregoing and other changes in form and details may be made therein without departing from the spirit and scope of the invention.

We claim:

1. An improved bucket brigade shift register device, comprising:
   a first bucket brigade switching device having an input electrode, an output electrode, and a control electrode, whose control electrode is connected to a first phase clock waveform and having a characteristic control electrode-to-output electrode capacitance at a first node, for propagating a charge signal from said input electrode to said first node when said first phase clock waveform is on;
   a second bucket brigade switching device having an input electrode connected to said first node, an output electrode, and a control electrode, whose control electrode is connected to a second phase clock waveform which is non-overlapping with said first phase clock waveform, said first and second switching devices forming a bucket brigade shift register, for propagating said charge signal from said first node to said output electrode of said second switching device when said second phase clock waveform is on;
   a capacitor of substantially equal magnitude to said characteristic control electrode-to-output electrode capacitance of said first bucket brigade switching device, connected between said first node and the inverse of said first phase clock waveform for supplying a compensating charge to said first node in response to said inverse of said first phase clock waveform to compensate for charge withdrawn through said control electrode-to-output electrode capacitance by said first phase clock waveform during its fall time;
   whereby said charge signal can be propagated through said first and second bucket brigade switching devices without diminishing its amplitude, thereby enhancing the charge transfer efficiency and dynamic range of the bucket brigade shift register.

2. The circuit of claim 1, wherein:
said first switching device is a field effect transistor with said input electrode being the source, the output electrode being the drain and the control electrode being the gate.

3. The circuit of claim 2, wherein: said bucket brigade shift register device is a series array of field effect transistors.

4. The circuit of claim 3, which further comprises:
said bucket brigade circuit being an N-channel MOSFET circuit.

5. The circuit of claim 3, which further comprises:
said bucket brigade circuit being a P-channel MOSFET circuit.

6. The circuit of claim 3, which further comprises:
the characteristic gate to drain capacitance of said first switching device being approximately 0.1 picofarads.

7. The circuit of claim 3, which further comprises:
an inverter circuit having an input connected to said first phase clock waveform and an output connected to said capacitor.

* * * * *